US 6,630,867 B2

(12) United States Patent
Canyon et al.

(10) Patent No.: US 6,630,867 B2
(45) Date of Patent: Oct. 7, 2003

(54) POWER AMPLIFIER WITH PROVISIONS FOR VARYING OPERATING VOLTAGE BASED UPON POWER AMPLIFIER OUTPUT POWER

(75) Inventors: James C. Canyon, San Diego, CA (US); Klaus D. Buehring, Agoura Hills, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 101 days.

(21) Appl. No.: 09/792,660

(22) Filed: Feb. 23, 2001

(65) Prior Publication Data

US 2001/0030580 A1 Oct. 18, 2001

Related U.S. Application Data

(60) Provisional application No. 60/184,682, filed on Feb. 24, 2000.

(51) Int. Cl.[7] .................................................. H03G 3/20
(52) U.S. Cl. .................................... 330/297; 330/285
(58) Field of Search ................................ 330/285, 297, 330/298

(56) References Cited

U.S. PATENT DOCUMENTS 6,008,698 A * 12/1999 Dacus et al. ............. 330/285 X
6,047,168 A *  4/2000 Carlsson et al. ......... 330/285 X

OTHER PUBLICATIONS

M. Ranjan, K.H. Koo, G. Hanington, C. Fallesen and P. Asbeck, "Microwave Power Amplifiers with Digitally–Controlled Power Voltage for High Efficiency and High Linearity".
G. Hanington, A. Metzger, P. Asbeck and H. Finlay, "Integrated DC—DC converter using GaAs HBT technology" Electronics Letters, Nov. 25th 1999, vol. 35, No. 24.

* cited by examiner

Primary Examiner—Steven J. Mottola
(74) Attorney, Agent, or Firm—Thomas, Kayden, Horstemeyer & Risley

(57) ABSTRACT

A power amplifier system is disclosed in which a power amplifier unit and a power management unit are provided. An operating voltage is applied to the power amplifier unit. The power management unit monitors the current drawn by the power amplifier unit and generates a control signal based upon the measured current. The operating voltage applied to the power amplifier unit is adjusted based upon the control signal.

26 Claims, 10 Drawing Sheets

POWER AMPLIFIER WITH PROVISIONS FOR VARYING OPERATING VOLTAGE BASED UPON POWER AMPLIFIER OUTPUT POWER

CLAIM OF PRIORITY

This application claims priority to co-pending U.S. provisional application entitled, "A POWER AMPLIFYING SYSTEM," having Ser. No. 60/184,682, filed Feb. 24, 2000, which is entirely incorporated by reference.

BACKGROUND OF THE INVENTION

1. Field of the Invention

This invention is generally related to power amplifiers and, more particularly, to a system for increasing overall efficiency of a power amplifier by varying operating voltage applied to a power amplifier based upon the output power level of the power amplifier.

2. Related Art

In personal communications devices such as cellular telephones, there is a trend toward minimizing size and weight. The size and weight are, however, contingent upon the size and weight of the various components that make up the personal communications device. In short, the smaller the various components of the personal communications devices, the smaller the size and overall weight of the personal communications device itself. Many personal communications devices have an overall size and weight which is, to a large degree, dominated by the size and weight of the battery which provides a supply voltage to the personal communications device. This is generally due to the fact that consumers want a personal communications device to have a prolonged operating time during usage.

As operating time requirements and power consumption of the personal communications device during operations increases, the size of the battery required to perform under these circumstances will also increase. Thus, where current or power consumption of the personal communications devices can be reduced; or the size of components can be reduced; the size of the battery can also be reduced. Alternatively, where the size of the battery remains constant, the operating time of the personal communications devices can be increased.

In typical personal communications devices such as, for example, wireless communication devices, efficiency of the device is optimized at maximum power output without regard to whether or not maximum power output is actually needed. Thus, as the power output of a typical wireless communications device, for example, drops below the maximum power (Max Power) output level, the efficiency of the wireless communications device also drops. This does not help to prolong the supply battery voltage and thus works to limit the operation time to the device.

SUMMARY

The invention provides a system for improving the efficiency of a power amplifier. Briefly described, in architecture, the system can be implemented as follows: a power amplifier unit and a power management unit are provided. An operating voltage is applied to the power amplifier unit. The power management unit monitors the current drawn by the power amplifier unit and generates a control signal based upon the measured current. The operating voltage applied to the power amplifier unit is adjusted based upon the control signal. Adjustment to the operating voltage may be made via the power management unit or via an external regulator unit.

The invention can also be viewed as providing a method for applying an operating voltage to a power amplifier unit. In this regard, the method can be broadly summarized by the following steps: An operating voltage Vbb is applied to a power amplifier unit 120. The current drawn by the power amplifier unit is then monitored and the current flow is measured. A current flow signal is generated and output based upon the measured current flow. The current flow signal is then received by a controller that generates a control signal based upon the current flow signal. The control signal is then output to a voltage regulator, which then adjusts the operating voltage applied to the power amplifier unit based upon the control signal.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The components in the drawings are not necessarily to scale, emphasis instead being placed upon clearly illustrating the principles of the invention. In the figures, like reference numerals designate corresponding parts throughout the different views.

DETAILED DESCRIPTION

The personal communications device of the invention provides for reduced power consumption by varying the operating voltage that is applied to the circuitry of the personal communications device. More particularly, the operating voltage applied to the power amplification unit of the personal communications device is varied based upon the measured output power level of power amplifier.

Figure 1:
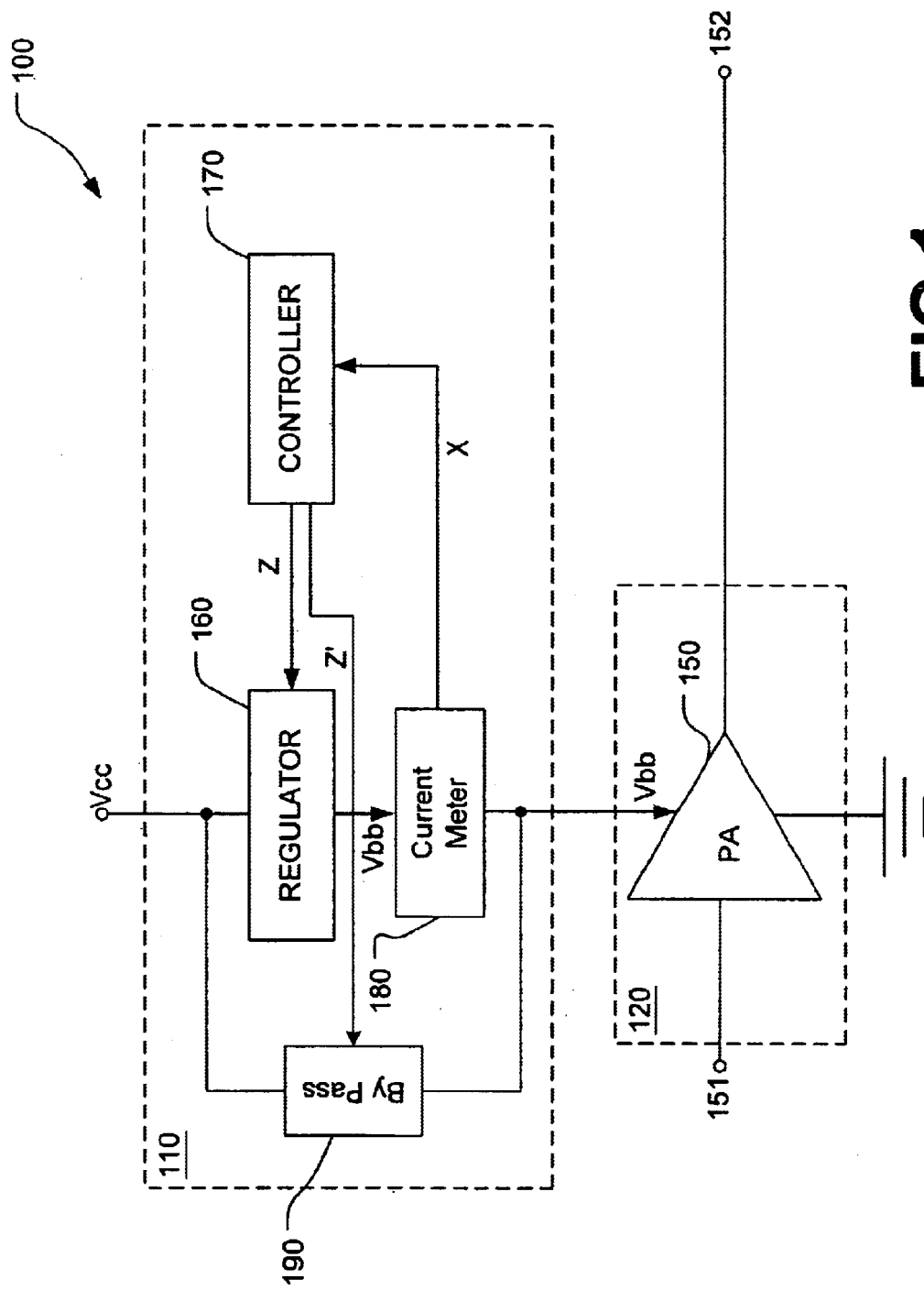
FIG. 1 is a block diagram illustrating a power amplifier control system.

FIG. 1 illustrates one embodiment of a personal communications device 100. A power amplifier unit 120 and power management unit 110 are provided. Power amplifier unit 120 includes a power amplifier 150. Power amplifier 150 includes an input 151 for receiving a radio frequency (RF) signal and an output 152 for outputting an amplified RF signal.

Power management unit 110 includes a current meter 180, a controller 170 and a regulator 160. An operating voltage Vbb is provided to the power amplifier 150 by voltage regulator 160. Switching regulator 160 receives a supply voltage Vcc of a predetermined voltage level and outputs an operating voltage Vbb to the power amplifier 150.

A current meter 180 monitors (measures) the DC current flow of the operating voltage supply Vbb provided to the power amplifier unit 120 and generates a current flow indicator signal X representative of the measured DC current flow of the operating voltage supply applied to the power amplifier unit 120. This current flow indicator signal X is provided to a controller 170. By monitoring the current Ibb drawn by the power amplifier unit 120, it is possible to determine the power output of the power amplifier unit 120. In this way, for a given current flow indicator signal X, there is a corresponding output power level at which the power amplifier unit 120 operates. By monitoring the current Ibb drawn by the power amplifier unit 120, it is possible to determine the power output of the power amplifier unit 120. In this way, the current signal X can also be considered indicative of the power output level of the power amplifier unit 120.

Controller 170 controls switching regulator 160 via providing a control signal Z. Control signal Z is generated by the controller 170 based upon the current flow indicated by the current flow indicator signal X.

The operating voltage Vbb output by the regulator 160 to the power amplifier 150 is determined in accordance with the control signal Z output by controller 170.

The operating voltage Vbb may be selected from any one of a predetermined number of voltage levels. For example, Vbb may be between 0 volts and the supply voltage Vcc. Further, Vbb may be linearly variable between, for example, 0 volts and Vcc, in accordance with the control signal Z.

Figure 2:
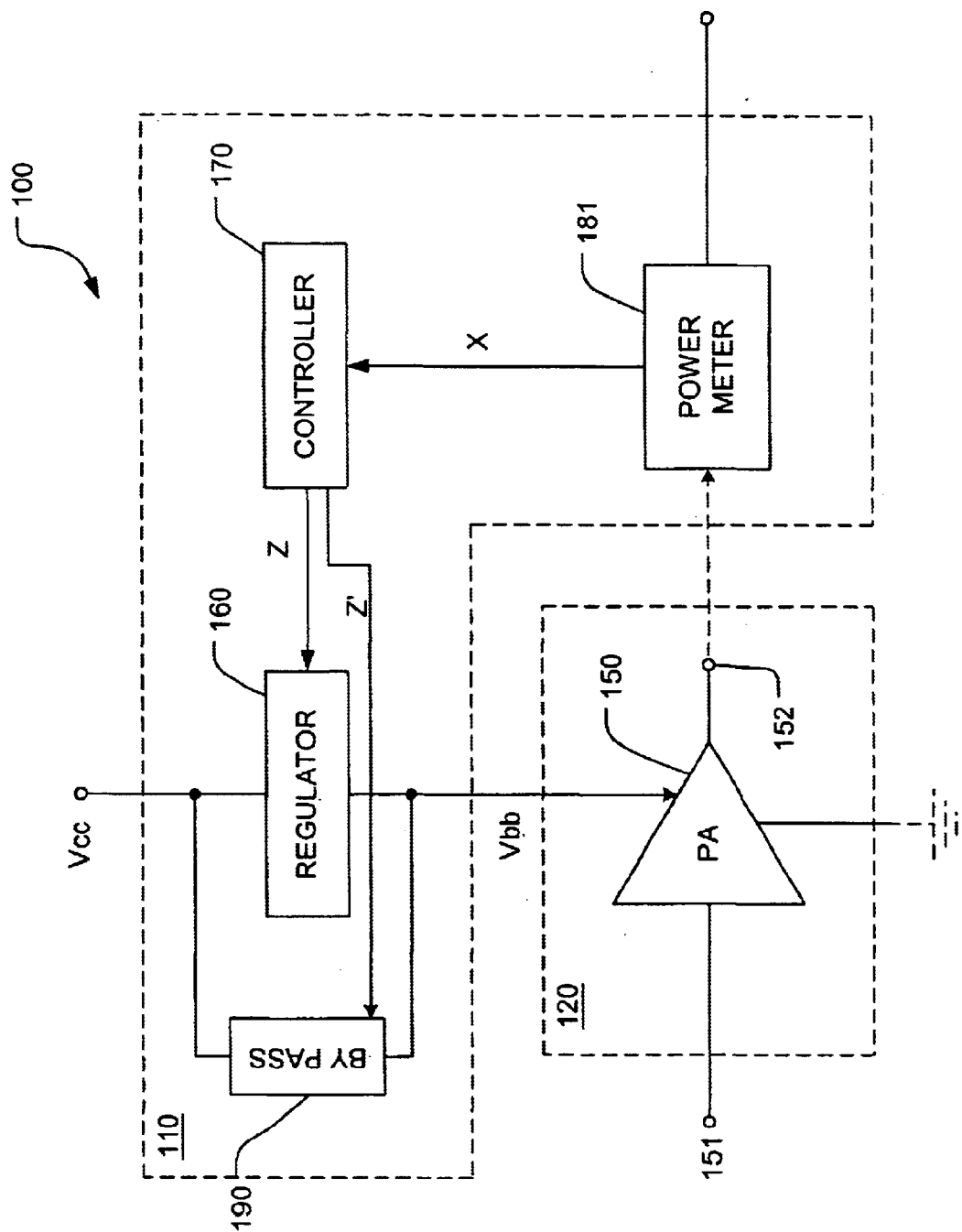
FIG. 2 is a block diagram illustrating another embodiment of a power amplifier control system.

FIG. 2 shows a block diagram illustrating a power amplifier control system. A power amplifier unit 120 is provided and includes a power amplifier 150. Power amplifier 150 includes an input 151 for receiving a radio frequency (RF) signal and an output 152 for outputting an amplified RF signal.

A power management unit 110 is provided. Power management unit 110 includes a meter 181, a controller 170, a regulator 160 and a bypass switch 190. The output 152 of power amplifier 150 is connected to a power meter 181.

Power meter 181 monitors (measures) the power at the output of the power amplifier 152 of power amplifier 150 and generates a power output indicator signal X.

This power output indicator signal X is then provided to the controller 170. Controller 170 receives the signal X and in turn, generates a control signal Z and a bypass signal Z'. Control signal Z varies depending upon the value of the power output indicator signal X. Control signal Z' also varies depending upon the value of the power output indicator signal X. Controller 170 controls regulator 160 via providing a control signal Z.

Regulator 160 receives a supply voltage Vcc of a predetermined voltage level and outputs an operating voltage Vbb to the power amplifier 150. The operating voltage Vbb output to the power amplifier 150 is determined in accordance with the control signal Z and bypass signal Z' output by controller 170. The operating voltage Vbb may be any one of a predetermined number of voltage levels between, for example, 0 volts and Vcc. Further, the operating voltage Vbb may be linearly variable between, for example, 0 volts and Vcc, in accordance with the control signal Z. In a preferred embodiment, the regulator 160 outputs a operating voltage Vbb, to the power amplifier unit 120, of approximately 2.2 volts (+2.2 VDC) where the power output indicator signal X indicates that the power amplifier unit 120 is operating at a power level of less than, for example, 22 dBM.

Bypass switch 190 is connected in parallel with the regulator 160 and receives input of the supply voltage Vcc. Bypass switch 190 is controlled by bypass signal Z', that causes the bypass switch 190 to open or close. When bypass switch 190 is closed, the operating voltage Vbb applied to the power amplifier unit 120 preferably goes to the operating supply voltage Vcc. In a preferred embodiment, bypass switch 190 is closed when the power output indicator signal X indicates that the power amplifier unit 120 is consuming, or operating at, a high power level. For example, where the power amplifier unit is consuming a power level greater than 22–24 dBm, the bypass signal Z' may be output by the controller 170 to close the bypass switch 190. Once bypass switch 190 is closed, the operating voltage Vbb applied to the power amplifier unit 120 is effectively taken to a level approximately equal to the supply voltage Vcc.

Figure 3:
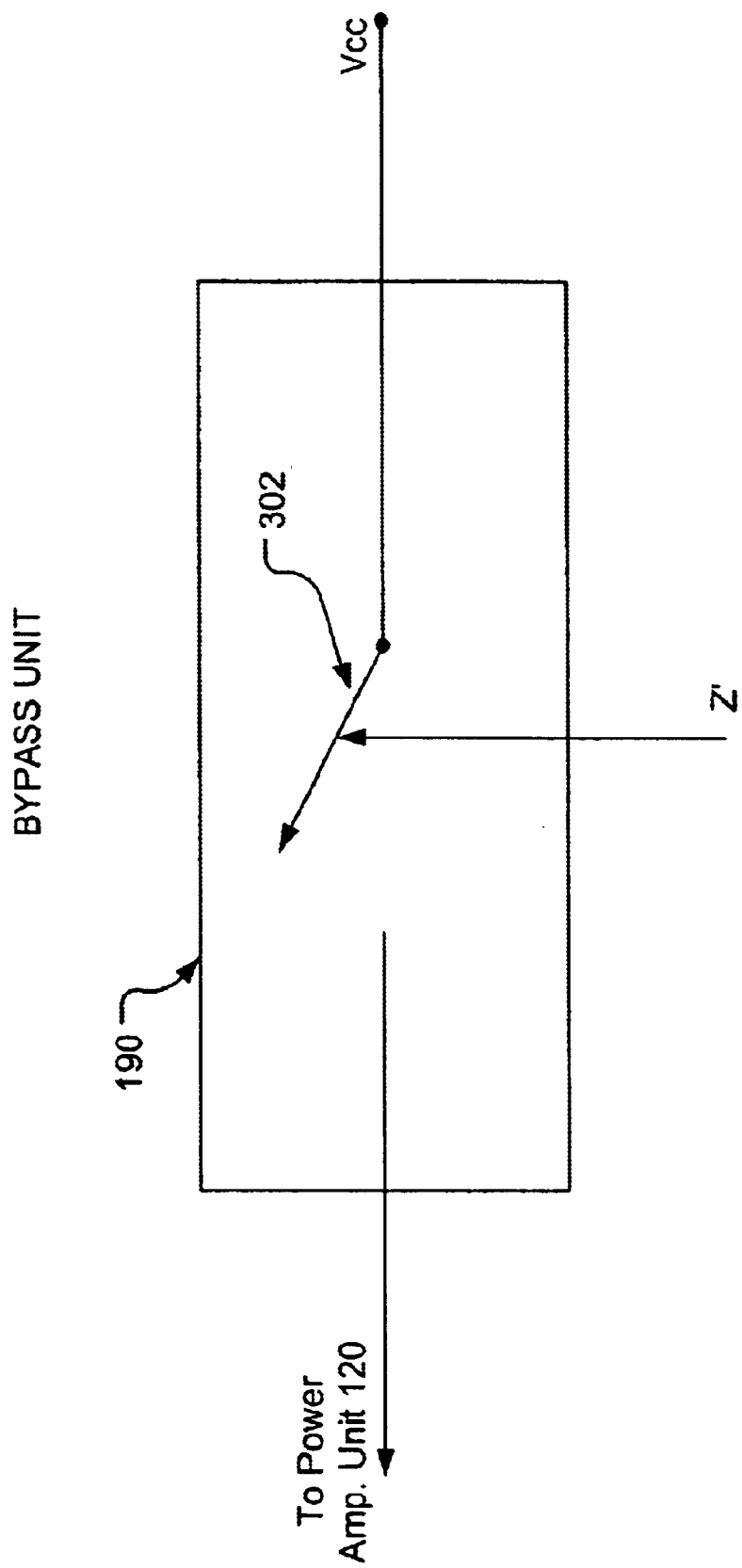
FIG. 3 is a block diagram illustrating a bypass unit 190.

FIG. 3 is a more detailed illustration of bypass unit 190. It can be seen that bypass unit 190 includes a switch 302 that is actuated by the bypass signal Z'. Bypass unit 190 may be configured, for example, by using transistor (semiconductor) switches for switch 302. Further, bypass unit 190 may be configured using electrically actuated mechanical switching devices as switch 302.

Figure 4:
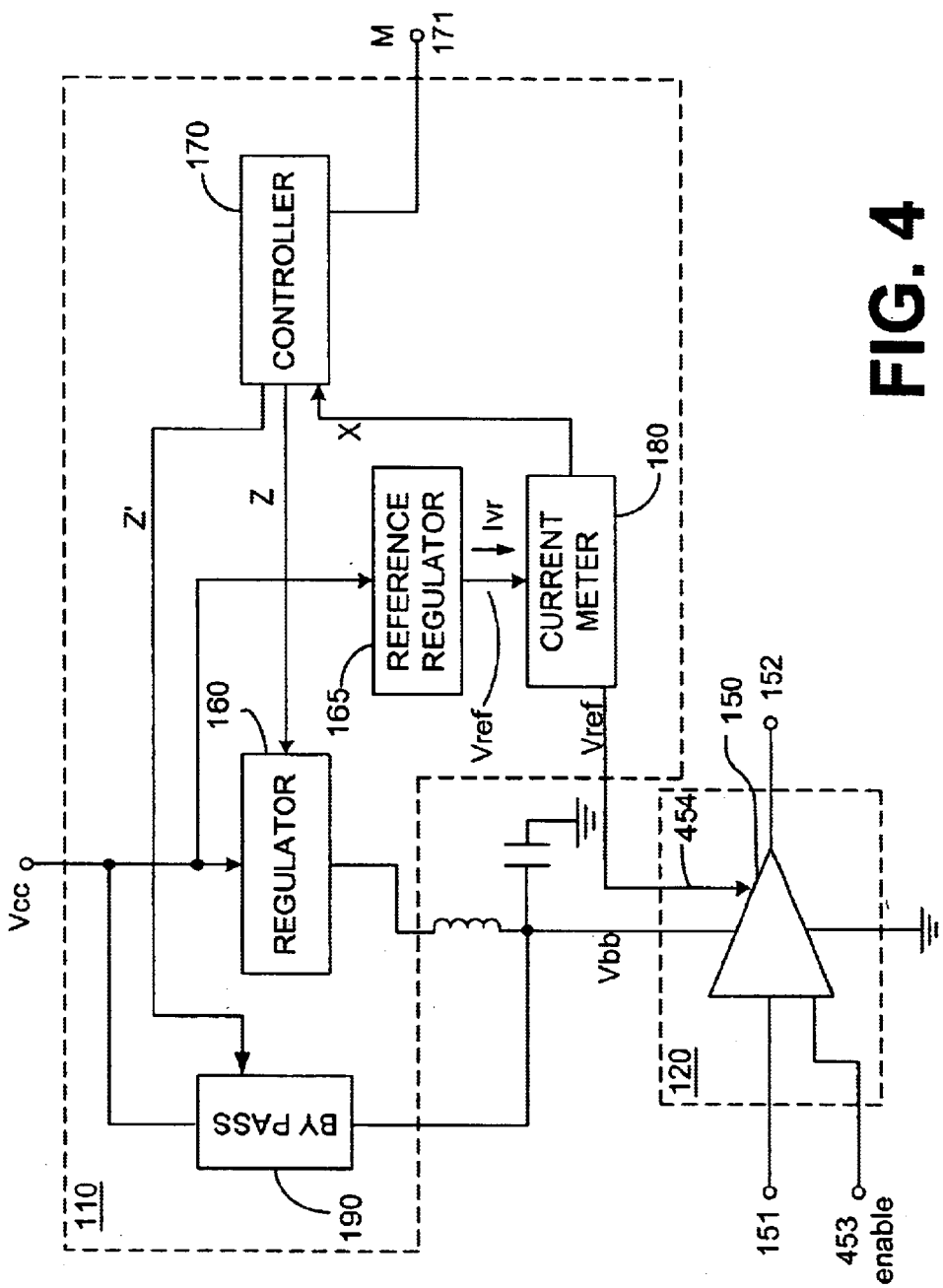
FIG. 4 is a block diagram illustrating another embodiment of a power amplifier control system.

FIG. 4 is a block diagram illustrating another embodiment of a power amplifier control system. A power amplifier unit 120 and power management unit 110 are provided. Power amplifier unit 120 includes a power amplifier 150. Power amplifier 150 includes an input 151 for receiving a radio frequency (RF) signal and an output 152 for outputting an amplified RF signal In addition, the power amplifier 150 of power amplifier unit 120 may provide for enable input (enable pin) 453 that is capable of turning on and off the power amplifier 150 by application of a predetermined signal. This signal may be, for example, a complementary metal oxide (CMOS) or transistor transistor logic (TTL) compliant/compatible signal. The power amplifier unit 120 may also provide for a reference voltage input (reference voltage pin) 454, which may be used to provide a reference voltage Vref to control the operation of the power amplifier 150. The reference voltage Vref may also be used to sense the output power of the power amplifier unit 120.

Power management unit 110 includes a current meter 180, a controller 170, a bypass switch 190, and a reference voltage regulator 165. An operating voltage Vbb is provided to the power amplifier 150 by voltage supply regulator 160. An operating voltage, Vref is supplied to the power amplifier 150 by the reference voltage regulator 165 through current meter 180. Current meter 180 monitors the current flow of the line providing the reference voltage Vref from the reference voltage regulator to the power amplifier 150 and generates a current indicator signal X that is applied to the controller 170. In turn, controller 170 outputs a control signal Z to the voltage regulator 160. Voltage regulator 160 receives a supply voltage Vcc of a predetermined voltage level and outputs an operating voltage Vbb to the power amplifier 150 in accordance with the control signal Z received from the controller 170.

The current meter 180 monitors (measures) the DC current flow of the reference voltage supply Vref provided to the power amplifier unit 120 and generates a current flow indicator signal X representative of the measured DC current flow of the operating voltage supply applied to the power amplifier unit 120. This current flow indicator signal X is provided to a controller 170. By monitoring the current Ivr drawn by the power amplifier unit 120, it is possible to determine the power output of the power amplifier unit 120. In this way, for a given current flow indicator signal X, there is a corresponding output power level at which the power amplifier unit 120 operates. By monitoring the current Ivr drawn by the power amplifier unit 120, it is possible to determine the power output of the power amplifier unit 120. In this way, the current signal X can also be considered indicative of the power output level of the power amplifier unit 120.

In one embodiment, controller 170 controls switching regulator 160 via control signal Z. Control signal Z may be generated by the controller 170 based upon the current flow indicated by the current flow indicator signal X.

The operating voltage Vbb output by the voltage regulator 160 to the power amplifier 150 is determined in accordance with the control signal Z output by controller 170. The operating voltage Vbb may be selected from any one of a predetermined number of voltage levels. Vbb may be between, for example, 0 volts and the supply voltage, Vcc. Further, Vbb may be linearly variable between, for example, 0 volts and Vcc, in accordance with the control signal Z. In a further embodiment, an external control signal M may be applied to the controller 170. In turn, the controller 170 generates the control signal Z in accordance with the external control signal M. Control signal M may be, for example, a logic signal generated by an external source associated with the system 100.

Figure 5:
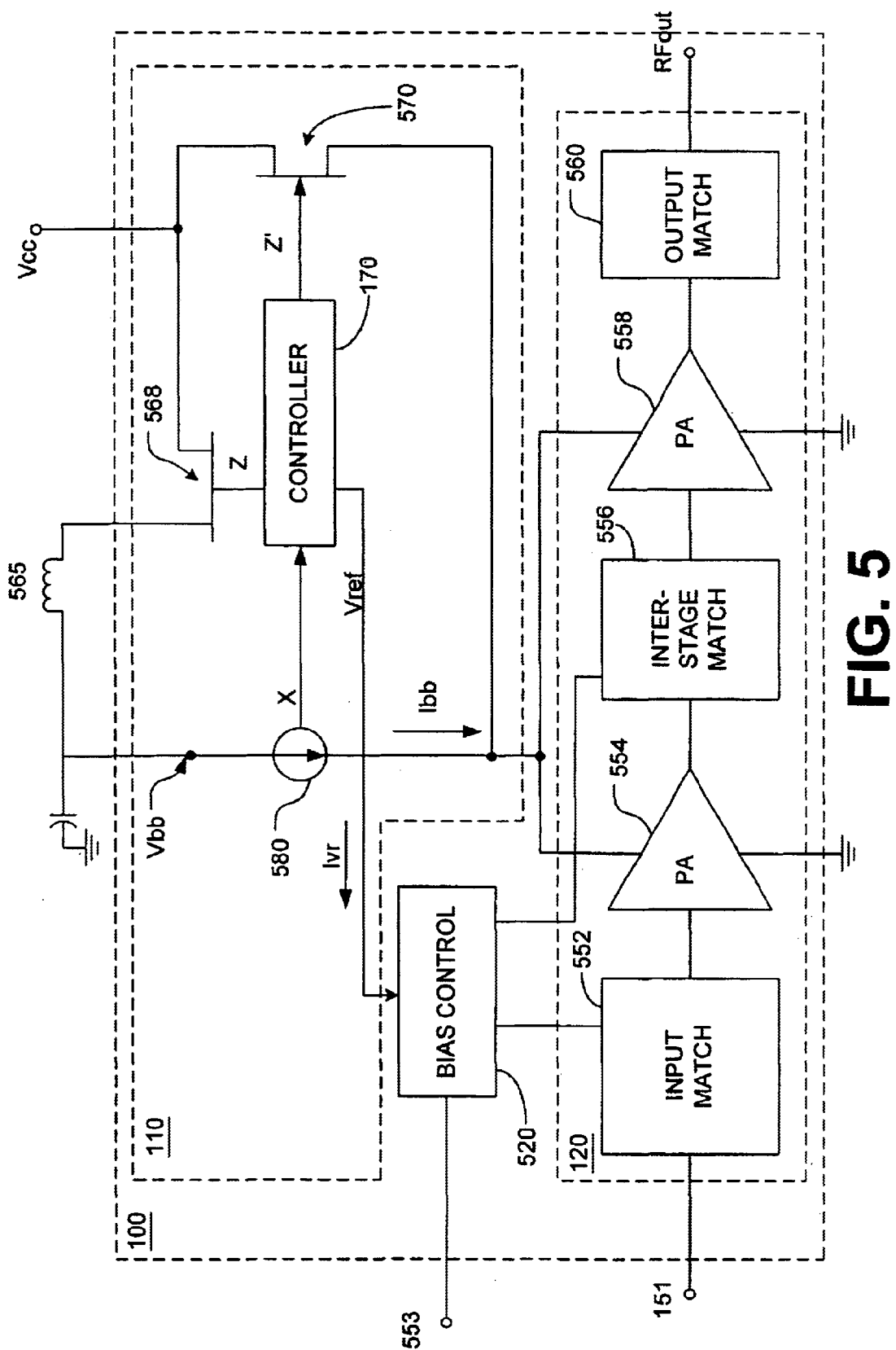
FIG. 5 is a block diagram illustrating an example of a detail configuration of the power amplifier control system in FIG. 1.

FIG. 5 shows a block diagram illustrating the power amplifier control system in FIG. 1. In this example, power amplifier unit 120 is a multi-stage power amplifier unit. Power amplifier unit 120 includes an input matching unit 552 for matching the impedance of the input 151 to a power amplifier 554. The output of power amplifier 554 is connected to an interstage matching unit 556. Interstage matching unit 556 matches the output impedance of power amplifier 554 to the input impedance of power amplifier 558. An output matching unit 560 is provided to match the output impedance of power amplifier 558 to the output 152. The bias control network 520 is capable of powering on (enabling) the amplifier unit 120 by using the reference current Ivr from the power management circuit 110 or by applying an appropriate enable signal to an enable pin 553 that may be optionally provided. Bias control 520 is preferably configured as a part of the power amplifier unit 120.

Power management unit 110 includes a current meter 580 and controller 170. Current meter 580 measures the current Ibb drawn by the power amplifier unit 120. A current signal X is generated to indicate the current Ibb drawn by the power amplifier unit 120.

Figure 6:
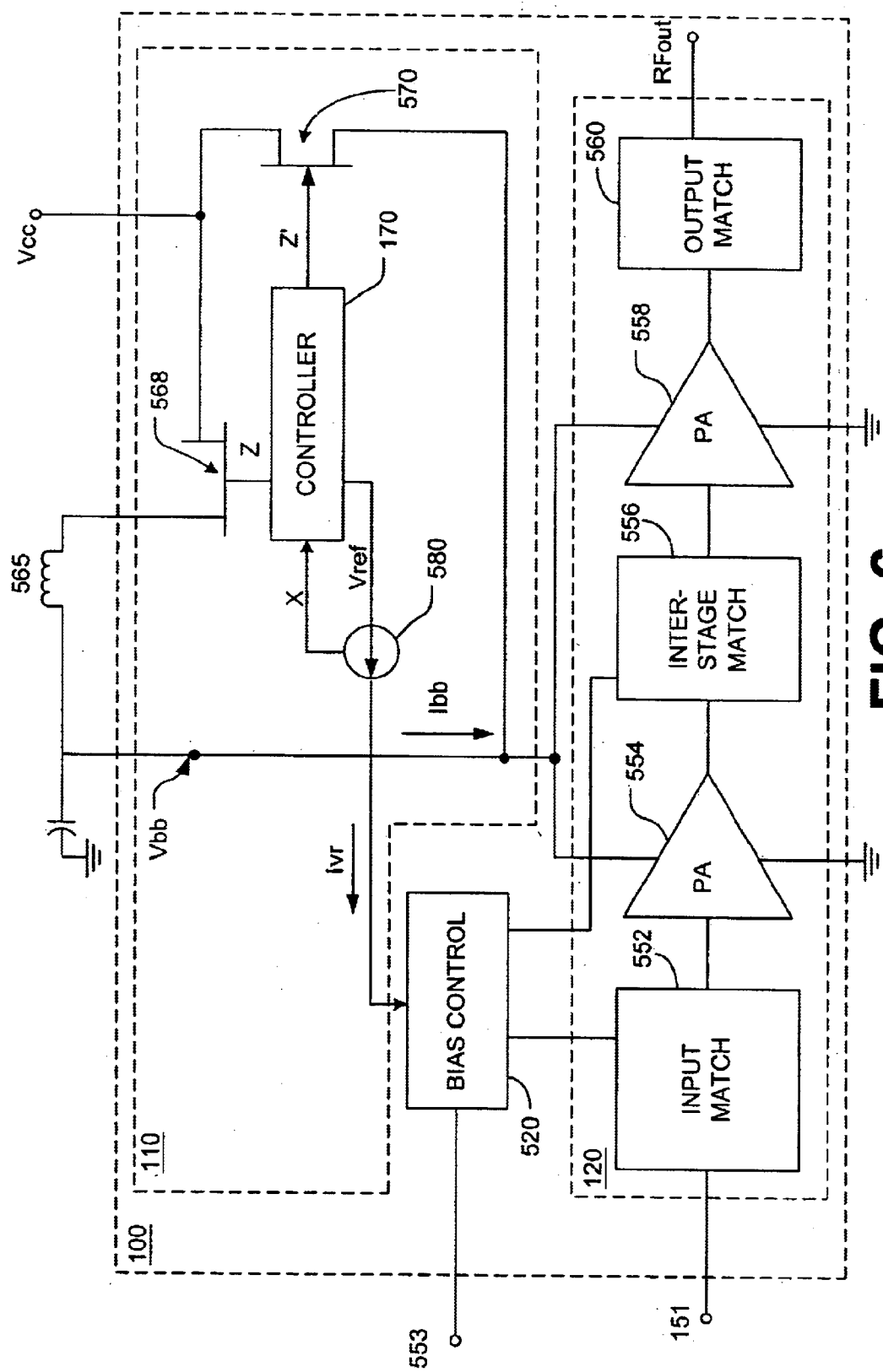
FIG. 6 is diagram detailing one configuration for determining power amplifier unit power consumption.

Alternatively, current meter 580 may be configured to measure the current Ivr drawn by the power amplifier unit 120 as shown in FIG. 6. In this case, a current signal X is generated to indicate the current Ivr drawn by the power amplifier unit 120.

For a given current flow indicator signal X, there is a corresponding output power level at which the power amplifier unit 120 operates. By monitoring the current Ibb drawn by the power amplifier unit 120, it is possible to determine the power output of the power amplifier unit 120. In this way, the current flow indicator signal X can also be considered indicative of the power output level of the power amplifier unit 120.

The current flow indicator signal X is provided to the controller 170. Controller 170 receives the current flow indicator signal X and in turn, generates a control signal Z and bypass signal Z'. Control signal Z and bypass signal Z' varies depending upon the value of the current flow indicator signal X. This control signal Z and the bypass signal Z' are each applied to the base of field effect transistors (FET) 568 and 570, respectively. FET 570 is controlled by control signal Z and is connected between the supply voltage Vcc and an inductor 365. FET 570 is controlled by bypass signal Z' and is connected between the supply voltage Vcc and the output of the inductor 565. The control signal Z causes the FET 568 to adjust current flow through the inductor 565 and in turn causes the operating voltage Vbb to be adjusted upward or downward as required. The control signal Z' causes the FET 570 to turn on completely so as to provide supply voltage Vcc directly to the power amplifier unit 120, thus greatly reducing the power losses between Vcc and the power amplifier unit 120 under high current operation.

Controller 170 also provides a reference voltage Vref to the bias controller 520. The reference voltage Vref is preferably independent of the operating voltage Vbb. In a preferred embodiment, reference voltage Vref is three volts (+3.0 VDC).

In one embodiment of the personal communications device 100, the operating voltage Vbb is, for example, between +3.0 and 4.2 volts DC (+3.0 VDC–+4.2 VDC). Further, where the current monitor 580 detects a current flow Ibb that corresponds to an amplifier power output of one milliwatt (1 mW), the controller 170 outputs a control signal Z and bypass signal Z' that causes the operating voltage Vbb to be adjusted to +0.6 volts DC (+0.6 VDC), thus greatly increasing the efficiency of the power amplifier unit 120.

The power amplifier unit 120 may be fabricated using gallium arsenide (GaAs) semiconductor technology. The power management unit 110 may also be fabricated using complementary metal oxide semiconductor (CMOS) technology. Further, both power amplifier unit 120 and power management unit 110 may be fabricated on a single integrated circuit. The integrated circuit may be configured in a package having a length of, for example, but not limited to, between 8.25–8.51 millimeters (mm); and a width of between 8.26–8.51 millimeters (mm). Alternatively, power amplifier unit 120 and power management unit 110 may be fabricated on separate integrated circuits.

Figure 7:
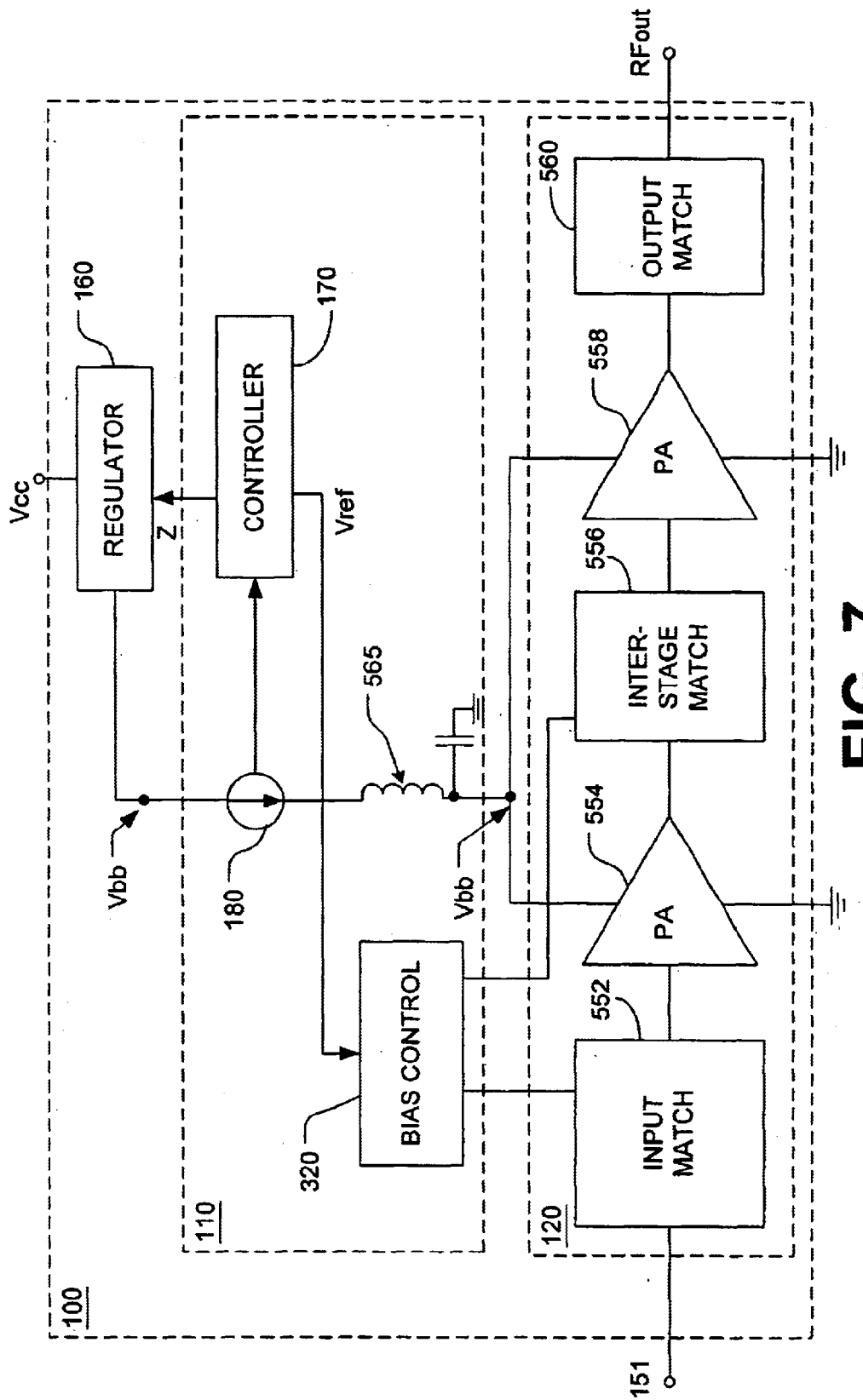
FIG. 7 is a further diagram detailing a configuration for determining power amplifier unit power consumption.

FIG. 7 shows a block diagram illustrating another embodiment of a power amplifier control system. In this embodiment, a regulator 160 is provided to supply the power amplifier unit 120 with an operating voltage Vbb. In this embodiment regulator 160 is external to the power management unit 110 and is controlled by a control signal Z from the controller 170. This embodiment provides for a personal communications device 100 in which the power amplifier unit 120 and power management unit 110 may be configured on a single integrated circuit, as discussed above with regard to FIG. 4, and utilized in conjunction with a separate voltage regulator. Voltage regulator 160 may be, for example, a switching voltage regulator.

Figure 8:
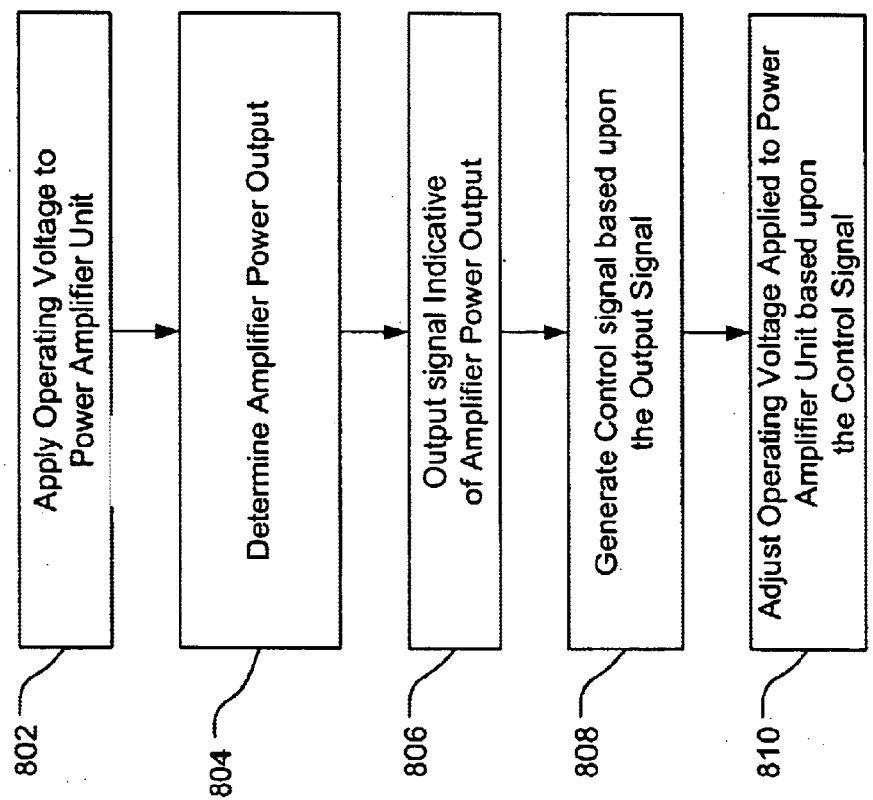
FIG. 8 is a flowchart illustrating a method of applying an operating voltage to a power amplifier unit of a personal communications device.

FIG. 8 is a flowchart illustrating a method of providing an operating voltage to a power amplifier unit. An operating voltage Vbb is applied to the power amplifier unit 120 (802). The current drawn by the power amplifier unit 120 is then monitored by, for example, a current meter 180, to measure the current flow Ibb (or, alternatively, the current flow Ivr) (804). A current flow signal is generated by the current meter 180 and output to a controller 170 based upon the measured current flow (806). The current flow signal is then received by a controller 170 that then generates a control signal based upon the current flow signal (808). The control signal is then output to a regulator 160 that then adjusts the operating voltage applied to the power amplifier unit 120 based upon the control signal (810).

Figure 9:
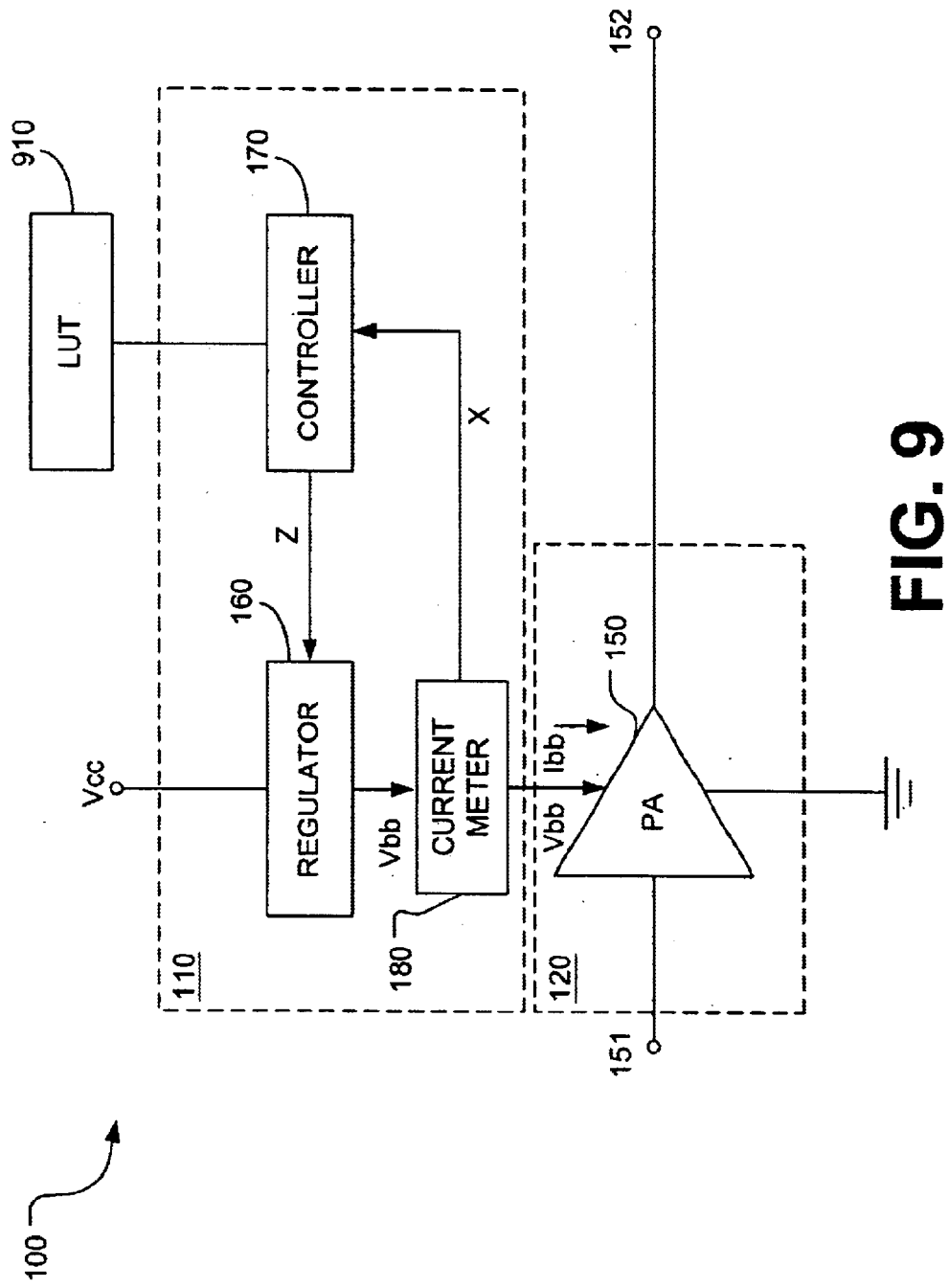
FIG. 9 is a block diagram illustrating a look up table ("LUT") for correlating current flow values with control signal values.

FIG. 9 illustrates an embodiment of a personal communications device in which a look-up table (LUT) 910 is incorporated and utilized for correlating a measured current value with a corresponding control value (control signal value). LUT 910 may be incorporated as a part of the power management unit 110. Alternatively, it may be external to the power management unit 110. A power amplifier unit 120 and power management unit 110 are provided. Power amplifier unit 120 includes a power amplifier 150. Power amplifier 150 includes an input 151 for receiving a radio frequency (RF) signal and an output 152 for outputting an amplified RF signal.

Power management unit 110 includes a current meter 180, a controller 170 and a regulator 160. An operating voltage Vbb is provided to the power amplifier 150 by voltage regulator 160. Regulator 160 receives a supply voltage Vcc of a predetermined voltage level and outputs an operating voltage Vbb to the power amplifier 150.

A current meter 180 monitors (measures) the DC current flow Ibb of the operating voltage supply Vbb provided to the power amplifier unit 120 and generates a current flow indicator signal X representative of the measured DC current flow of the operating voltage supply applied to the power amplifier unit 120. This current flow indicator signal X is provided to a controller 170. Controller 170 accesses and refers to the LUT 910 to obtain a control signal value corresponding to the current flow indicator signal X. The control signal value Z is then output to the regulator 160. In turn regulator 160 adjusts the operating voltage Vbb output based upon the control signal Z value retrieved from LUT 910 and provides the operating voltage Vbb to the power amplifier unit 120.

The operating voltage Vbb may be selected from any one of a predetermined number of voltage levels. Vbb may be between, for example, 0 volts and the supply voltage, Vcc. Further, Vbb may be linearly variable between, for example, 0 volts and Vcc, in accordance with the control signal Z.

Figure 10:
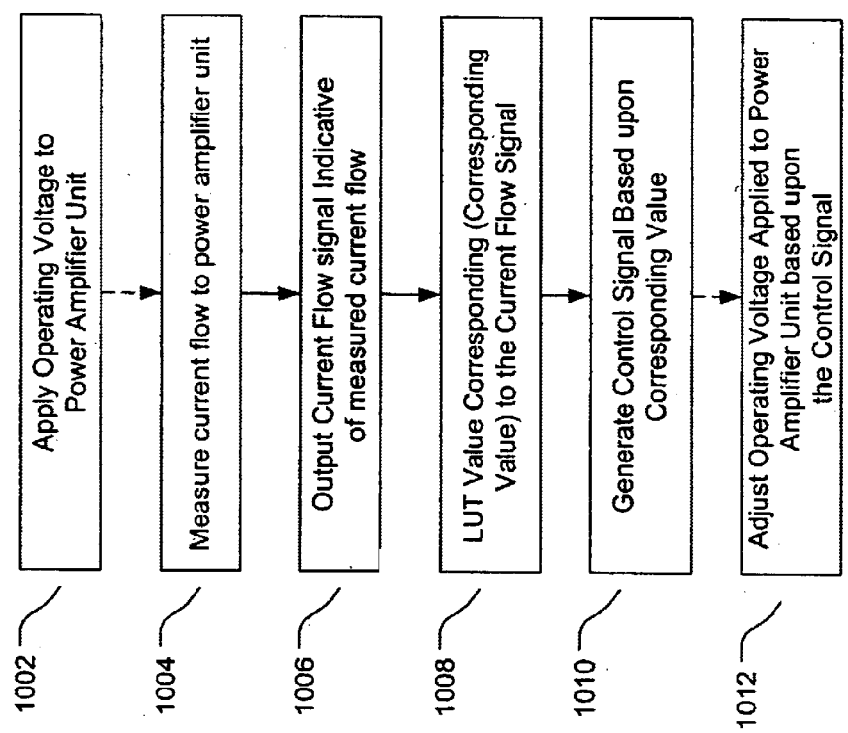
FIG. 10 is a flowchart illustrating another method of applying an operating voltage to a power amplifier unit of a personal communications device.

FIG. 10 is a flowchart illustrating a further method of providing an operating voltage to a power amplifier unit. It can be seen that an operating voltage Vbb is applied to the power amplifier unit 120 (1002). The current drawn by the power amplifier unit 120 is then monitored by, for example, a current meter 180, to measure the current flow Ibb (or, alternatively, the current flow Ivr) (1004). A current flow signal is generated by the current meter 180 and output to a controller 170 based upon the measured current flow (1006). The controller 170 refers to a look-up table (LUT) to determine a value that corresponds to the measured current flow (1008). The controller 170 then outputs a control signal based upon the corresponding value (1010). The control signal is then output to a regulator 160 that then adjusts the operating voltage applied to the power amplifier unit 120 based upon the control signal (1012).

The flow charts of FIG. 8 and FIG. 10 show the architecture, functionality, and operation of a possible implementation of the software capable of carrying out the methodology set out therein. In this regard, each block represents a module, segment, or portion of code, which comprises one or more executable instructions for implementing the specified logical function(s). It should also be noted that in some alternative implementations, the functions noted in the blocks may occur out of the order noted in the flowcharts of FIG. 8 and FIG. 10. For example, two blocks shown in succession in the flowcharts may in fact be executed substantially concurrently or the blocks may sometimes be executed in the reverse order, depending upon the functionality involved.

While various embodiments of the invention have been described, it will be apparent to those of ordinary skill in the art that many more embodiments and implementations are possible that are within the scope of this invention.

What is claimed:

1. A personal communications device comprising:
    a power amplifier for receiving an input signal and outputting an amplified signal;
    a supply voltage interface for receiving a supply voltage from a battery power source; and providing an operating voltage to the power amplifier; and
    a controller for determining a power consumption of the power amplifier and varying the operating voltage provided to the power amplifier in accordance with the determined power consumption of the power amplifier.

2. A power amplifier comprising:
    an amplifier stage for receiving an input signal and outputting an amplified signal;
    a supply voltage interface for receiving a supply voltage and providing an operating voltage to the amplifier stage; and
    a controller for determining a power consumption of the amplifier stage and varying the operating voltage provided to the amplifier stage in accordance with the determined power consumption of the amplifier stage.

3. The power amplifier of claim 2, further comprising a power monitor for monitoring the power consumed by the amplifier stage.

4. The power amplifier of claim 3, wherein the controller varies the operating voltage in accordance with a signal from the power monitor.

5. The power amplifier according to claim 3, further comprising a look-up table (LUT) which specifies a predetermined operating voltage level for a given current level.

6. The power amplifier according to claim 5, wherein the controller causes the operating voltage to be varied in accordance with the look-up table and the current level signal from the current meter.

7. The power amplifier according to claim 2, wherein the operating voltage is varied linearly in relation to the power consumption of the amplifier stage.

8. A power amplifier comprising:
    an amplifier stage for receiving an input signal and outputting an amplified signal;
    a battery interface for receiving a supply voltage and providing the supply voltage to the amplifier stage;
    a controller for varying the supply voltage provided to the amplifier stage in accordance with the power consumption of the amplifier stage;
    a power monitor for monitoring the power consumed by the amplifier stage; and
    a look-up table (LUT) which specifies a predetermined supply voltage level for a given current level.

9. The power amplifier according to claim 8, wherein the controller causes the supply voltage to be varied in accordance with the look-up table and the current level.

10. The power amplifier according to claim 2, further comprising a bypass switch that communicates with the controller to determine applying the supply voltage to the amplifier stage through the bypass switch.

11. A method of applying a power supply voltage to a power amplifier unit comprising the steps of:

applying an operating voltage to the power amplifier unit;

measuring the power drawn by the power amplifier unit;

generating a power signal indicative of the power drawn by the power amplifier unit;

generating a control signal based upon the power signal that is indicative of the power drawn by the power amplifier unit; and adjusting the operating voltage based upon the control signal.

12. The method of claim 11, further comprising monitoring the power consumed by the power amplifier unit.

13. The method of claim 12, wherein adjusting the operating voltage is in accordance with the monitoring signal from the power monitor.

14. The method of claim 12, further comprising specifying a predetermined operating voltage level for a given current level via a look-up table (LUT).

15. The method of claim 14, wherein adjusting the operating voltage is in accordance with the look-up table and the current level signal from a current meter.

16. The method of claim 11, wherein adjusting the operating voltage is varied linearly in relation to the power consumption of the power amplifier unit.

17. The method of claim 11, further comprising applying the supply voltage to the power amplifier unit through a bypass switch.

18. A power amplifier comprising:

an amplifier stage for receiving an input signal and outputting an amplified signal;

a battery supply voltage interface for receiving a supply voltage and providing an operating voltage to the amplifier stage;

a controller for varying the operating voltage provided to the amplifier stage in accordance with the power consumption of the amplifier stage; and a power monitor for monitoring the power consumed by the amplifier stage.

19. The power amplifier according to claim 18, wherein the controller varies the operating voltage in accordance with a signal from the power monitor.

20. The power amplifier according to claim 18, further comprising a look-up table (LUT) which specifies a predetermined operating voltage level for a given current level.

21. The power amplifier according to claim 20, wherein the controller causes the operating voltage to be varied in accordance with the look-up table and the current level signal from the current meter.

22. The power amplifier according to claim 18, further comprising a bypass switch that communicates with the controller to determine applying the supply voltage to the amplifier stage through the bypass switch.

23. A method of applying a power supply voltage to a power amplifier unit comprising the steps of:

applying an operating voltage to the power amplifier unit;

measuring the power drawn by the power amplifier unit;

generating a power signal indicative of the power drawn by the power amplifier unit;

generating a control signal based upon the power signal;

adjusting the operating voltage based upon the control signal; and monitoring the power consumed by the power amplifier unit.

24. The method of claim 23, wherein adjusting the operating voltage is in accordance with the monitoring signal from the power monitor.

25. The method of claim 23, further comprising specifying a predetermined operating voltage level for a given current level via a look-up table (LUT).

26. The method of claim 25, wherein adjusting the operating voltage is in accordance with the look-up table (LUT) and the current level signal from a current meter.

* * * * *